United States Patent [19]

Hitomi

[11] Patent Number: 4,492,914

[45] Date of Patent: Jan. 8, 1985

[54] TEMPERATURE-COMPENSATING BIAS CIRCUIT

[75] Inventor: Hisakazu Hitomi, Yokohama, Japan

[73] Assignee: Tokyo Shibaura Denki Kabushiki Kaisha, Kawasaki, Japan

[21] Appl. No.: 515,579

[22] Filed: Jul. 20, 1983

[30] Foreign Application Priority Data

Jul. 29, 1982 [JP] Japan .................. 57-131242

[51] Int. Cl.³ .................................. G05F 3/16
[52] U.S. Cl. .......................... 323/313; 323/229; 323/907
[58] Field of Search ............. 323/229, 311–315, 323/907; 307/296 R, 297, 310, 317 R

[56] References Cited

U.S. PATENT DOCUMENTS

| | | | |
|---|---|---|---|
| 2,769,137 | 10/1956 | Creusere | 323/229 |
| 3,281,656 | 10/1966 | Noble | 323/907 X |
| 3,758,791 | 9/1973 | Taniguchi et al. | 307/310 X |
| 3,934,476 | 1/1976 | Lamb | 307/310 X |

FOREIGN PATENT DOCUMENTS 941705 11/1963 United Kingdom .
988800 4/1965 United Kingdom .

*Primary Examiner*—Peter S. Wong
*Attorney, Agent, or Firm*—Oblon, Fisher, Spivak, McClelland & Maier

[57] ABSTRACT

A temperature-compensating bias circuit for biasing a transistor circuit such as a multivibrator is disclosed. In the bias circuit, a series circuit formed of a first resistor and a parallel circuit consisting of a first circuit includes a second resistor and n diodes and a second circuit which includes a third resistor and m diodes, is connected between a power source line and a ground line. A voltage generated from a bias output terminal for driving the multivibrator has the effect of cancelling temperature drift of the multivibrator, and includes temperature drift represented by a temperature coefficient which varies according to the number of diodes in the first and second circuits.

6 Claims, 7 Drawing Figures

TEMPERATURE-COMPENSATING BIAS CIRCUIT

BACKGROUND OF THE INVENTION

This invention relates in general to a bias circuit for supplying a given bias voltage and, more particularly, to a temperature-compensating bias circuit which compensates for temperature drift in a transistor circuit that is biased, for instance, an emitter-coupled astable multivibrator.

The operating characteristics of transistor circuits are usually subject to deviations with varying ambient temperatures. For example, the oscillation frequency of an emitter-coupled astable multivibrator involves what is commonly called "temperature drift" and varies undesirably with variations in the ambient temperature. In order to compensate for deviations from the regular operating characteristics of the transistor circuit due to the temperature drift noted above, it has been proposed to construct a bias circuit for supplying a bias voltage which determines the oscillation frequency of a multivibrator, for instance, such that the bias voltage itself involves a temperature drift. With such a bias circuit, the bias voltage generated therefrom and supplied to the transistor circuit can vary with the ambient temperature and cancel out the temperature drift of the multivibrator.

Hitherto, however, it has been difficult to realize a bias circuit of the type noted above which can supply a bias voltage, has a desired temperature dependency, and has a temperature coefficient which is adjustable. Therefore, a prior art bias circuit could not effectively temperature-compensate transistor circuits having various temperature drifts, and it has been impossible to solve the temperature drift problem in such transistor circuits.

SUMMARY OF THE INVENTION

It is an object of the present invention to provide a new and improved bias circuit, which has a temperature coefficient capable of being readily adjusted to a desired value so that it can effectively compensate for temperature changes in a transistor circuit to which it is connected.

According to the invention, in order to attain the above object, there is provided a bias circuit which comprises a first resistor having one end connected to a first line supplied with a power source voltage, a first circuit connected between the other end of the first register and a ground line supplied with a second voltage and including a series circuit of a second resistor and n ($n \geq 0$) diodes, and a second circuit connected in parallel with the first circuit and including a series circuit of a third resistor and m ($m \geq 0$, $n+m > 1$) diodes. A voltage appearing at the common junction of the two circuits and first resistor, is provided as the bias circuit voltage from the bias circuit. For the temperature compensation, the temperature coefficient of the bias voltage can be readily adjusted to a desired value in a voltage range within the power source voltage level by suitably determining the numbers n and m of diodes in the first and second circuits and then suitably selecting the resistance values of the first to third resistors.

BRIEF DESCRIPTION OF THE DRAWINGS

The present invention is best understood by reference to the accompanying drawings, in which.

DETAILED DESCRIPTION OF THE PREFERRED EMBODIMENT

Figure 1:
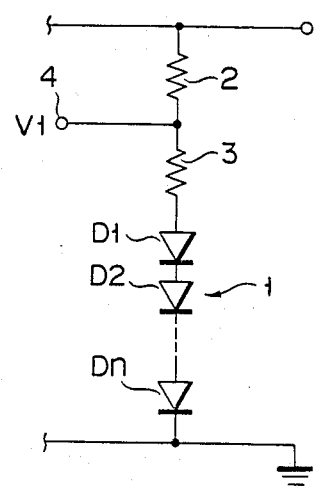
FIG. 1 is a circuit diagram showing a prior art bias circuit.

Prior to describing the invention in detail, a prior art temperature-compensating bias circuit will be described with reference to FIG. 1 in order to facilitate understanding of the present invention. The prior art bias circuit illustrated in FIG. 1 effects temperature compensation by making use of the fact that the forward resistance of a diode decreases with increasing ambient temperature. The bias circuit comprises a series circuit consisting of resistors 2 and 3 and n (n being a positive integer) diodes $D_1, D_2, \ldots, D_n$. The resistor 2, which constitutes one end of the series circuit, is supplied with a power source voltage $V_{CC}$. The diode $D_n$, which constitutes the other end of the series circuit, is grounded. An output terminal 4 is connected to the junction between the resistors 2 and 3 for obtaining the voltage across the resistor 2 as a bias voltage $V_{bias}$. This output terminal 4 is connected to a bias voltage input terminal of a transistor circuit (not shown) to be biased and temperature compensated. The bias voltage $V_{bias}$ provided from the temperature-compensating bias circuit 1 is given as $$V_{bias} = \frac{R_2}{R_2 + R_3} (V_{CC} - nV_D) \quad (1)$$

where, $R_2$: resistance of the resistor 2,
$R_3$: resistance of the resistor 3, and
$V_D$: forward or contact potential drop across diode D.

The rate of change $\partial V_{bias}/\partial T_A$ of the bias voltage $V_{bias}$ with respect to temperature $T_A$ is $$\frac{\partial V_{bias}}{\partial T_A} = - \frac{nR_2}{R_2 + R_3} \cdot \frac{\partial V_D}{\partial T_A} \quad (2)$$

From equation 2 it is obvious that the bias voltage $V_{bias}$ set by the bias circuit 1 includes a temperature drift.

As noted earlier, the operating characteristic of the transistor circuit that is determined by the bias voltabe $V_{bias}$ is temperature drift-compensated by varying the bias voltage $V_{bias}$ according to the temperature. As will be described later in detail, however, in order to obtain effective temperature compensation, the value $-nR_2/(R_2+R_3)$, which is the temperature coefficient $\alpha$ of the bias voltage $V_{bias}$, must be set to a certain value peculiar to the transistor circuit connected to the bias circuit 1. That is, the temperature coefficient $\alpha = -nR_2/(R_2+R_3)$ must be adjustable to a desired value.

The temperature coefficient α is adjusted by suitably selecting the number n of diodes D and then selecting the resistance $R_2$ and $R_3$. However, the temperature coefficient cannot be adjusted continuously but only stepwise and only integral numbers can be selected for the number n. In other words, with the prior art temperature compensating bias circuit 1, the temperature coefficient of the bias voltage $V_{bias}$ cannot be exactly adjusted to any desired value but can only be adjusted to an approximate value. With mere approximation of the desired temperature coefficient, the temperature compensation that can be obtained is imperfect, and a temperature drift is still involved to some extent in the operating characteristic of the transistor circuit connected to the bias circuit 1. In the actual use of the transistor circuit, this temperature drift must be compensated for. To this end, additional compensating means must be provided. This increases the size and cost of the circuit.

Figure 2:
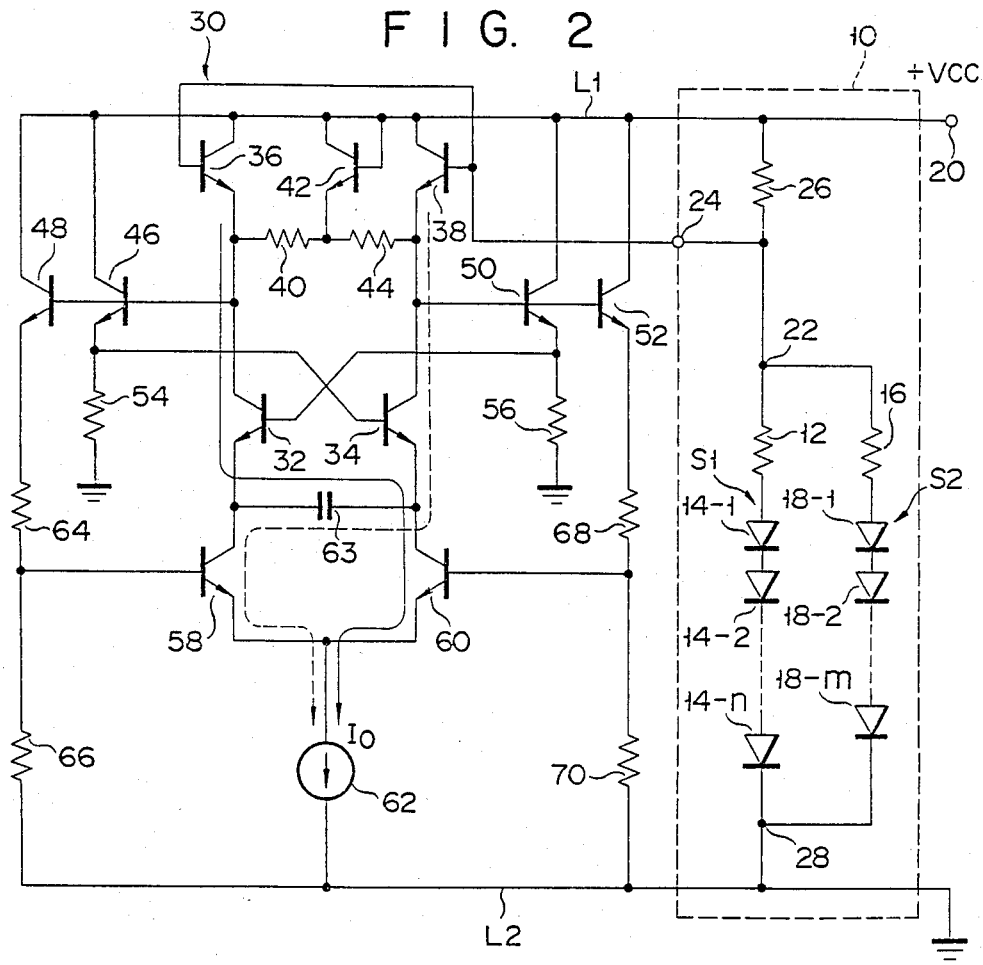
FIG. 2 is a circuit diagram illustrating a bias circuit used for an astable multivibrator in accordance with the invention.

Referring now to FIG. 2, there is shown a preferred embodiment of the temperature-compensating bias circuit according to the present invention. This embodiment is applied to an emitter-coupled astable multivibrator as a transistor circuit. Reference numeral 10 designates the bias circuit according to the invention. It includes a first series circuit $S_1$ consisting of a resistor 12 and n (n being a positive integer) diodes 14-1, 14-2, ..., 14-n and a second series circuit $S_2$ consisting of a resistor 16 and m (m being a positive integer and n>m) diodes 18-1, 18-2, ..., 18-m. The two series circuits $S_1$ and $S_2$ are connected in parallel. The diodes 14 and 18 are connected between a power source terminal 20, to which a source voltage $+V_{CC}$ is applied, and the ground so as to be forward-biased by the voltage $V_{CC}$. The junction 22 between the resistors 12 and 16 in circuits $S_1$ and $S_2$ is connected to a bias voltage output terminal 24, and also connected to a power source line $L_1$ connected to the power source terminal 20 through a resistor 26. A cathode common junction 28, to which the cathodes of diodes 14-n and 18-m in circuits $S_1$ and $S_2$ are commonly connected, is connected to a ground line $L_2$. It should be noted that the bias output terminal 24 is connected to the junction between a resistor 26 and the parallel circuit consisting of circuits S1 and S2, the resistor 26 and the parallel circuit being connected in series between the power source line $L_1$ and ground line $L_2$.

The bias voltage $V_{bias}$ that is obtained from the temperature-compensating bias circuit 10 is given as $$V_{bias} = V_{CC} - V_{24} \tag{3}$$

where $V_{24}$: potential at the junction (i.e., potential at the terminal 24). Also, from a relation $$\frac{V_{CC} - V_{24}}{R_{26}} = \frac{V_{24} - nV_d}{R_{12}} + \frac{V_{24} - mV_D}{R_{16}} \tag{4}$$

where,
$R_{26}$: resistance of the resistor 26,
$R_{12}$: resistance of the resistor 12,
$R_{16}$: resistance of the resistor 16, and
$V_D$: contact potential drop (or barrier potential drop) across the diode 14 and 18,
the bias voltage $V_{bias}$ can be expressed as $$V_{bias} = \frac{\left(\frac{1}{R_{12}} + \frac{1}{R_{16}}\right) V_{CC} - \left(\frac{n}{R_{12}} + \frac{m}{R_{16}}\right) V_D}{\frac{1}{R_{26}} + \frac{1}{R_{12}} + \frac{1}{R_{16}}} \tag{5}$$

The rate of change $\partial V_{bias}/\partial T_A$ of the bias voltage $V_{bias}$ with respect to the ambient temperature $T_A$ is thus $$\frac{\partial V_{bias}}{\partial T_A} = \frac{\frac{n}{R_{12}} + \frac{m}{R_{16}}}{\frac{1}{R_{26}} + \frac{1}{R_{12}} + \frac{1}{R_{16}}} \cdot \frac{\partial V_D}{\partial T_A} \tag{6}$$

From equation 6, the temperature coefficient α of the bias voltage $V_{bias}$ of the bias circuit 10 is given as $$\alpha = \frac{\frac{n}{R_{12}} + \frac{m}{R_{16}}}{\frac{1}{R_{26}} + \frac{1}{R_{12}} + \frac{1}{R_{16}}} \tag{7}$$

In the embodiment of FIG. 2, the transistor circuit that is connected to the bias circuit 10 is an emitter-coupled astable multi-vibrator 30, such as for an FM modulator of a video tape recorder (VTR) or video cassette recorder (VCR), for example.

In the multivibrator 30, a pair of npn switching transistors 32 and 34 have their collectors connected to the power source line $L_1$ through respective npn transistors 36 and 38. The collector of switching transistor 32 is also connected to the emitter of an npn transistor 42 through a resistor 40. The base and collector of transistor 42 are connected to the power source line $L_1$. The collector of the other switching transistor 34 is connected to the emitter of transistor 42 through a resistor 44. The collector of transistor 32 is connected to the base of transistor 34 through the base-emitter path of an npn transistor 46, and is also connected to the base of an npn transistor 48. The transistors 46 and 48 are connected to the power source line $L_1$ at their collectors. On the other hand, the collector of transistor 34 is connected to the base of transistor 32 through a base-emitter path of an npn transistor 50 whose collector is connected to the power source line $L_1$ and also to the base of an npn transistor 52 whose collector is connected to the line $L_1$. The transistors 46 and 50 are grounded at their emitters through resistors 54 and 56, respectively. It should be noted that the bases of transistors 36 and 38 are commonly connected to the aforementioned bias voltage output terminal 24 of the bias circuit 10 according to the present invention. In other words, bias voltage $V_{bias}$ generated by the circuit 10 is directly supplied to the bases of transistors 36 and 38.

The emitters of transistors 32 and 34 are each connected to the collectors of npn transistors 58 and 60, which have their emitters connected to each other and also connected to the ground level $L_2$ through a current source 62. A capacitor 63 is provided between the emitters of transistors 32 and 34. The emitter of transistor 48 is connected to the base of transistor 58 through a resistor 64, and is also connected to the ground line $L_2$ through resistors 64 and 66. The emitter of the transistor 52 is connected to the base of transistor 60 through a resistor 68 and also connected to the ground through resistors 68 and 70.

Figure 3:
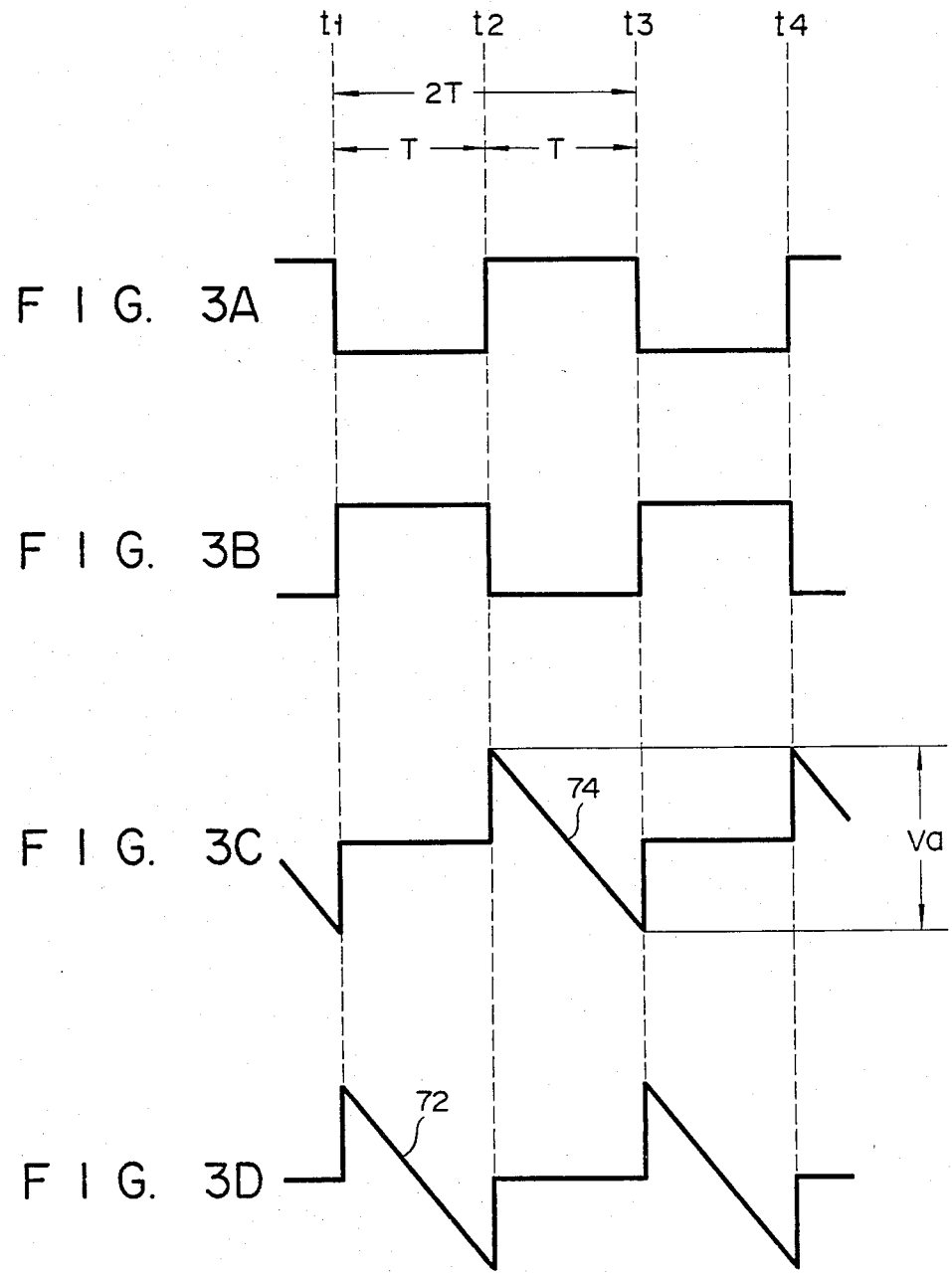
FIGS. 3A to 3D are diagrams illustrating signal waveforms generated at the main parts of the multivibrator connected to the bias circuit shown in FIG. 2.

The operation mode of the circuit of FIG. 2 including the bias circuit 10 and multivibrator 30 will now be described with reference to FIGS. 3A to 3D. FIGS. 3A and 3B are waveform diagrams showing the potentials ($V_{C32}$ and $V_{C34}$) at the collectors of switching transistors 32 and 34, while FIGS. 3C and 3D are waveform diagrams showing the potentials ($V_{E32}$ and $V_{E34}$) at the emitters of transistors 32 and 34.

The pair of switching transistors 32 and 34 are alternately and repeatedly rendered conductive, whereby the oscillating operation of the multivibrator 30 is obtained. At instant $t_1$ in FIG. 3, for example, one transistor 32 (first switching transistor) is rendered conductive, while the other transistor 34 (second switching transistor) is rendered nonconductive. At this time, the transistor 36 connected to the first switching transistor 32 is also rendered conductive, so that the collector potential $V_{C32}$ on the first switching transistor 32 becomes lower than the potential $V_{24}$ at the output terminal 24 of the bias circuit 10 by the base-emitter voltage drop $V_{BE36}$ across the transistor 36. The potential $V_{24}$ at the output terminal 24 is equal to the difference between the source voltage $V_{CC}$ and the bias voltage $V_{bias}$ of the bias circuit 10. The collector voltage $V_{C32}$ at the instant $t_1$ is thus $$V_{C32(t=t1)} = V_{CC} - V_{bias} - V_{BE36} \quad (8)$$

At this time, the collector voltage $V_{C34}$ on the nonconductive second switching transistor 34 is $$V_{C34(t=t1)} = V_{CC} - V_{BE42} \quad (9)$$

where, $V_{BE42}$: base-emitter voltage across the transistor 42.

The emitter potential $V_{E32}$ on the first switching transistor 32 at instant $t_1$ is $$V_{E32(t=t1)} = V_{CC} - V_{BE42} - V_{BE50} - V_{BE32} \quad (10)$$

where, $V_{BE42}$: base-emitter voltage across the transistor 42,
$V_{BE50}$: base-emitter voltage across the transistor 50,
$V_{BE32}$: base-emitter voltage across the transistor 32.

A constant current $I_0$ shown by the solid line in FIG. 2 flows through the transistor 60, which is rendered conductive in response to the ON operation of the transistor 32. The capacitor 63 is charged by the constant current $I_0$ flowing in the illustrated direction. As the capacitor 64 is charged, the emitter voltage $V_{E34}$ on the second switching transistor 34 decreases at a constant rate after instant $t_1$ as shown by reference numeral 72 in FIG. 3D. With the decrease of the emitter voltage $V_{E34}$ the base-emitter voltage $V_{BE34}$ of the second switching transistor 34 eventually assumes a predetermined value at an instant $t_2$, whereupon the transistor 34 is inverted from the conductive to nonconductive state. If the emitter voltage on the transistor 34 at the time of the inversion is indicated by $V_{BE(ON)}$, the emitter voltage $V_{E34}$ on the transistor 34 at this instant $t_2$ is given as $$V_{E34} = V_{B34} - V_{BE34(ON)} \quad (11)$$

where, $V_{B34}$: base potential on the transistor 34.

Since the potential $V_{B34}$ is lower than the base-emitter voltage $V_{BE46}$ of the transistor 46 by the collector potential $V_{C34}$ on the transistor 34, $$V_{B34(t=t2)} = V_{C32} - V_{BE46} \quad (12)$$

$$= V_{CC} - V_{bias} - V_{BE36} - V_{BE46}$$

From the equations 11 and 12, the emitter potential $V_{E34}$ on the second switching transistor 34 at the instant $t_2$ is given as $$V_{E34(t=t1)} = V_{CC} - V_{bias} - V_{BE36} - V_{BE46} - V_{BE34(ON)} \quad (13)$$

When the second switching transistor 34 is inverted from the nonconductive to conductive state at instant $t_2$, the first switching transistor 32 is rendered nonconductive. At this instant $t_2$ the collector potentials $V_{C32}$ and $V_{C34}$ on the transistors 32 and 34 are $$\left. \begin{array}{l} V_{C32(t=t2)} = V_{CC} - V_{BE42} \\ V_{C34(t=t2)} = V_{CC} - V_{bias} - V_{BE38} \end{array} \right\} \quad (14)$$

The emitter potential $V_{E34}$ on the transistor 34 at this time is, like the emitter potential $V_{E32}$ on the transistor 32 at the previous instant $t_1$, $$V_{E34(t=t2)} = V_{CC} - V_{BE42} - V_{BE46} - V_{BE34} \quad (15)$$

where, $V_{BE34}$: base-emitter voltage of the conductive transistor 34

It should be noted that the increment $V_{E2(inc)}$ of the second transistor emitter potential $V_{E34}$ at the instant $t_2$ is equal to the difference between the equations 13 and 15, that is, $$V_{E34(inc)} = V_{bias} + V_{BE36} - V_{BE42} + V_{BE34(ON)} - V_{BE34} \quad (16)$$

The resistance $R_{12}$ of the resistor 12 is selected such that an equal current flows in the collectors of transistors 36 and 24 when the transistor 36 is conductive. Thus, the voltages $V_{BE36}$ and $V_{BE42}$ are equal to each other (that is, $V_{BE36} = V_{BE42}$). The equation 16 thus can be written as $$V_{E34(inc)} = V_{bias} + V_{BE34(ON)} - V_{BE34} \quad (16')$$

Hence, the first transistor-emitter potential $V_{E32(t=t2)}$ at the instant $t_2$ is expressed as $$V_{E32(t=t2)} = \quad (17)$$

$$V_{CC} - V_{BE42} - V_{BE50} - V_{BE32} + V_{bias} + V_{BE34(ON)} - V_{BE34}$$

After instant $t_2$, the first switching transistor 32 is nonconductive while the second switching transistor 34 is conductive. In this state, the constant current $I_0$ flows in the direction as shown by the dashed line in FIG. 2. The emitter potential $V_{E32}$ on the first transistor decreases at a constant rate as indicated by reference numeral 74 in FIG. 3C. At an instant $t_3$, the decreasing potential $V_{E32}$ becomes $$V_{E32} = V_{CC} - V_{bias} - V_{BE38} - V_{BE50} - V_{BE32(ON)} \quad (18)$$

where, $V_{BE32(ON)}$: base-emitter voltage of the transistor 32 necessary for the inversion from the nonconductive to conductive state.

At this time, the first switching transistor 32 is again rendered conductive to render the second switching transistor 34 nonconductive. At the instant $t_3$ the emitter potential $V_{E32(t=t2)}$ is thus restored to $$V_{E32(t=t2)} = V_{CC} - V_{BE42} - V_{BE50} - V_{BE32} \quad (19)$$

The increment component $V_{E32(inc)}$ of the potential $V_{E32}$ at instant $t_3$ is $$V_{E32(inc)} = V_{bias} + V_{BE38} - V_{BE42} + V_{BE32(ON)} - V_{BE32} \quad (20)$$

In this condition, we have $$V_{E32(inc)} = V_{bias} + V_{BE32(ON)} - V_{BE32} \quad (20')$$

because the resistance value $R_{44}$ of the resistor 44 is selected such that $V_{BE38} = V_{BE42}$. Thus, at the instant $t_3$ the second transistor emitter potential $V_{E34(t=t3)}$ assumes a value higher than the potential $(=V_{CC} - V_{BE42} - V_{BE36} - V_{BE34})$ in the time interval between the instants $t_2$ and $t_3$ by the increment shown by the equation 20', that is, $$V_{E34(t=t3)} = \quad (21)$$
$$V_{CC} - V_{BE42} - V_{BE46} - V_{BE34} + V_{bias} + V_{BE32(ON)} - V_{BE32}$$

The switching transistors 32 and 34 of the multivibrator 30 are then repeatedly and alternately switched, so that their collector potentials $V_{C32}$ and $V_{C34}$ have pulse waveforms corresponding to the oscillation output of the multivibrator 30, having a constant cycle (2T) as shown in FIGS. 3A and 3B. In this condition, the change in the terminal voltage across the capacitor 64 that is caused by the change in the potential $V_{C32}$ during the time period T corresponds to the value between $V_{E32(t=t2)}$ and $V_{E32(t=t3)}$ as indicated by $V_a$ in FIG. 3C. (That is, the change in the terminal voltage across the capacitor 64 is $2 V_{bias} + V_{BE32(ON)} - V_{BE32} + V_{BE34(ON)}$ which is the difference between $V_{CC} - V_{bias} - V_{BE38} - V_{BE50} - V_{BE32(ON)}$ and $V_{CC} - V_{BE42} - V_{BE50} - V_{BE32} + V_{bias} + V_{BE34(ON)} - V_{BE34}$.) With the switching transistors 32 and 34 selected to be symmetrical, $V_{BE32} = V_{BE34}$ and $V_{BE32(ON)} = V_{BE34(ON)}$. The change $V_a$ in the voltage across the capacitor 64 is thus $$V_a = 2(V_{bias} + V_{BE32(ON)} - V_{BE32}) \quad (22)$$

Denoting the capacitance of the capacitor 64 by C, $$C \cdot 2(V_{bias} + V_{BE32(ON)} - V_{BE32}) = I_0 \cdot T \quad (23)$$

The oscillation frequency $f_0$ of the multivibrator 30 is thus $$f_0 = \frac{1}{2T} = \frac{I_0}{4CV_{cpt}} \quad (24)$$

In this equation 24, $V_{cpt}$ represents terminal voltage across the capacitor 64 when the switching transistors 32 and 34 are alternately on-off switched, that is, $$V_{cpt} = V_{bias} + V_{BE34(ON)} - V_{BE32} \quad (25)$$

The above equation 24 thus can be written, in view of equation 25, as $$f_0 = \frac{I_0}{4C(V_{bias} + V_{BE34(ON)} - V_{BE32})} \quad (24')$$

It will be apparent from equation 24' that the bias output voltage $V_{bias}$ of the bias circuit 10 is a parameter having direct influence on the oscillation frequency $f_0$ of the multivibrator 30. The oscillation frequency $f_0$ can be adjusted by varying the constant current $I_0$, as is evident from equation 24'. The multivibrator 30 can thus be used as an FM modulator for a video tape recorder (VTR) if it is arranged such that an image signal is supplied to it as the input signal and the constant current $I_0$ is changed in response to this input signal and has the same phase.

The oscillation frequency $f_0$ of the multivibrator 30 thus arranged includes temperature drift. This is so because the terminal voltage $V_{cpt}$ across the capacitor 63 includes temperature drift as noted previously. The temperature drift of the capacitor terminal voltage $V_{cpt}$ stems from the following fact. At instant $t_2$, at which time the switching transistor 34 is rendered conductive, the collector currents in the two switching transistors 32 and 34 are actually not equal. This gives rise to a difference between the temperature coefficients of the base-emitter voltages $V_{BE32}$ and $V_{BE34}$ of these transistors 32 and 34. In order to understand this in greater detail, consider now the collector current $I_{C34(ON)}$ in the second switching transistor 34 at the instant $t_2$. If the emitter potential $V_{E34}$ on the transistor 34 is reduced by $\Delta V$ while the transistor 34 is nonconductive before instant $t_2$, it increases the current through the resistor 44 by an amount $\Delta V \cdot gm_{34}$ where $gm_{34}$ is the mutual conductance of the transistor 34. This current increase reduces the collector potential $V_{C34}$ on the transistor 34 by $V \cdot gm_{34} \cdot R_{44}$. This change in the collector potential $V_{C34}$ is directly fed back to the emitter of the transistor 34 through the transistor 50, base-emitter junction of the transistor 32 and capacitor 64. In order for the transistor 32 to be inverted from the nonconductive to conductive state at this time, the loop gain G given as $$G = \frac{\Delta V \cdot gm_{34} \cdot R_{44}}{\Delta V} = gm_{34} \cdot R_{44} \quad (26)$$

must be no less than unity. The transistor 34 is thus rendered conductive as soon as the loop gain G becomes G=1 (at instant $t_2$). Denoting the collector current in the transistor 34 at this instant by $I_{C34(ON)}$, the mutual conductance is given as $$gm_{34} = \frac{q}{RT_A} \cdot I_{C24(ON)} \quad (27)$$

where,
R: Boltzmann's constant,
$T_A$: absolute temperature, and
q: unit charge
With the collector current $I_{C34(ON)}$ obtained as such, the base-emitter voltage $V_{BE34(ON)}$ on the transistor 34 at the time of the inversion thereof is given as $$I_{C34(ON)} = \frac{RT_A}{q \cdot R_{44}} \quad (28)$$

The base-emitter voltage $V_{BE34(ON)}$ of the transistor 34 at the time of inversion thereof is thus given as $$V_{BE34(ON)} = \frac{RT_A}{q} \ln \frac{I_{C34(ON)}}{I_S} \quad (29)$$
$$= \frac{RT_A}{q} \ln \frac{RT_A}{I_S \cdot qR_{44}}$$

where, $I_S$: saturation current in the transistors 32 and 34.
Since the collector current $I_{C32}$ in the transistor 32 is equal to $I_0$, the base-emitter voltage $V_{BE32}$ on the transistor 32 at the time of the inversion thereof is $$V_{BE32} = \frac{RT_A}{q} \ln \frac{I_0}{I_S} \quad (30)$$

From equations 29, 30 and 25, the terminal voltage $V_{cpt}$ across the capacitor 63 at the time of the inversion is given as $$V_{cpt} = V_{bias} - \frac{RT_A}{q} \ln \frac{qR_{44}I_0}{RT_A} \quad (31)$$

It will be understood that the capacitor terminal voltage $V_{cpt}$ is a function of the absolute temperature $T_A$ and includes a negative temperature drift. The oscillation frequency $f_0$ given by the equation 24 thus includes a positive temperature drift.

The temperature drift of the multivibrator 30 itself, however, can be cancelled by the temperature dependency of the bias voltage $V_{bias}$ of the bias circuit 10 according to the invention, which includes a similar temperature drift. It is thus possible to obtain efficient temperature compensation in the multivibrator 30.

The change rate $\partial V_{cpt}/\partial T_A$ of the capacitor voltage $V_{cpt}$ shown by the equation 31 with respect to the absolute temperature $T_A$ is $$\frac{\partial V_{cpt}}{\partial T_A} = \frac{\partial V_{bias}}{\partial T_A} - \frac{R}{q}\left(\ln \frac{qR_{44}I_0}{RT_A} - 1\right) \quad (32)$$

The temperature drift can be eliminated if $\partial V_{cpt}/\partial T_A$ in equation 32 can be reduced to zero. According to the present invention, the value $\partial V_{cpt}/\partial T_A$ can be readily reduced to zero, as is verified in the following.

By substituting equation 6 into equation 32, we obtain a relation $$\frac{\partial V_{cpt}}{\partial T_A} = -\frac{\frac{n}{R_{12}} + \frac{m}{R_{16}}}{\frac{1}{R_{26}} + \frac{1}{R_{12}} + \frac{1}{R_{16}}} \cdot \frac{\partial V_D}{\partial T_A} - \quad (33)$$

$$\frac{R}{q}\left(\ln \frac{qR_{44}I_0}{RT_A} - 1\right)$$

It should be clear that $\partial V_{cpt}/\partial T_A$ in equation 33 can be reduced to zero at a given temperature by independently selecting the parameters n and m, i.e., the number of diodes 14 and 18 in the bias circuit 10, and then suitably setting the resistance values $R_{26}$, $R_{12}$ and $R_{16}$.

Figure 4:
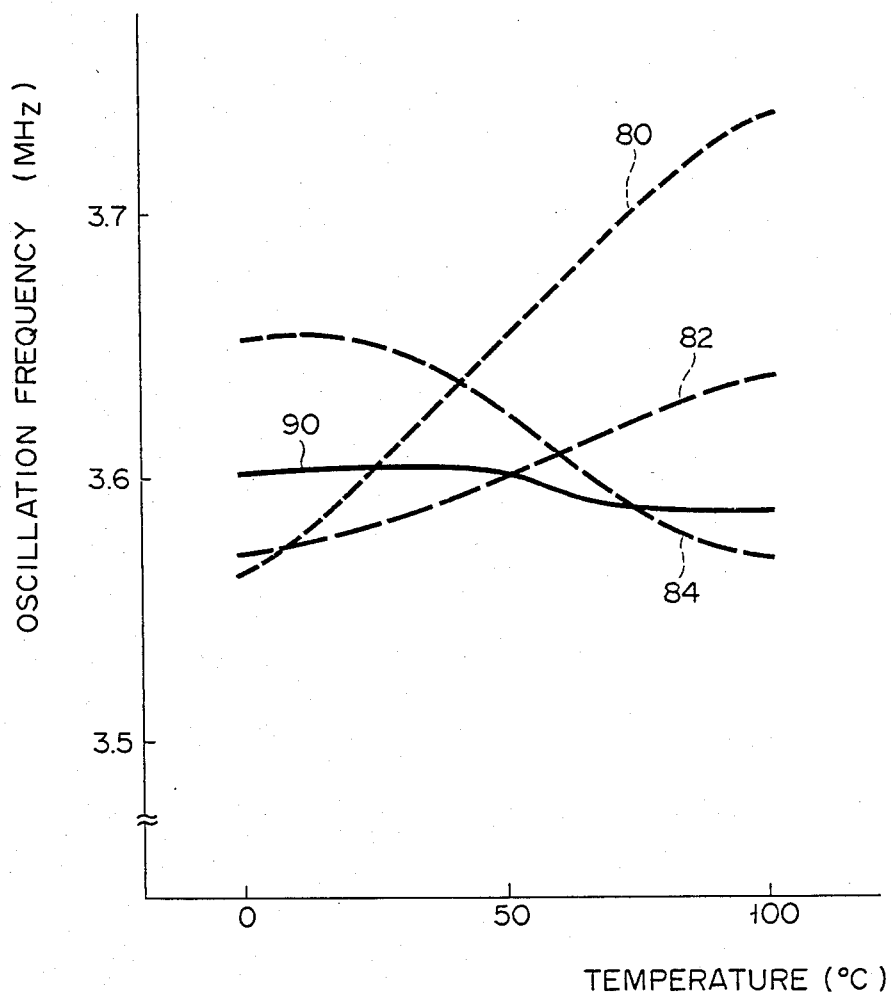
FIG. 4 is a diagram illustrating the temperature dependency characteristics of the oscillation frequency of a multivibrator biased by the bias circuit of FIG. 2 and prior art bias circuits.

The graph of FIG. 4 shows the temperature dependency of the oscillation frequency $f_0$ of the multivibrator 30. The characteristics in the graph were obtained by setting $R_{40} = R_{44} = 1.6$ kΩ
$R_{26} = 500$ Ω
$R_{12} = 6$ kΩ
$R_{64} = R_{68} = 5.3$ kΩ
$R_{66} = R_{70} = 6$ kΩ
$C_{64} = 120$ μF
and
$I_0 = 720$ μA in the circuit of FIG. 2 including the multivibrator 30. Curve 80 in FIG. 4 represents the temperature dependency of the oscillation frequency $f_0$ of the multivibrator 30 in the prior art bias circuit 1 of FIG. 1 with zero diodes D. In this case, the oscillation frequency $f_0$ is changed by 175 kHz with an ambient temperature change from 0° C. to 100° C. Curves 82 and 84 represent temperature dependency characteristics in a case where the prior art bias circuit 1 has one diode and two diodes, respectively. The characteristics of the curves 82 and 84 are better than the characteristic of curve 80. However, the oscillation frequency changes of 68 and 83 kHz, respectively, are still considerable. The characteristics of curves 82 and 84 cancelling each other out; the oscillation frequency $f_0$ is increasing in the former and decreasing in the latter along with the increasing temperature. It is seen that in order to obtain effective temperature compensation of the multivibrator 30 used with the prior art circuit 1 of FIG. 1, the number of diodes D is somewhere between 1 and 2. The number of diodes D, however, can only be an integral number, so that it is impossible to obtain better temperature compensation so long as the prior circuit arrangement is used. With the bias circuit 10 used for the multivibrator 30, the change in the oscillation frequency $f_0$ with the same temperature change as noted above can be only approximately 16 kHz as shown by curve 90 in FIG. 4. This data was obtained by actual measurements conducted by the invertor by setting the following circuit parameters in the bias circuit 10.

$R_{26}$: 500 Ω
$R_{12}$: 11.3 kΩ
$R_{16}$: 8.7 kΩ
Number n of diodes 14: 2, and
Number m of diodes 18: 1

Although the present invention has been shown and described with reference to a particular embodiment, various changes and modifications which are obvious to a person skilled in the art to which the invention pertains are deemed to line within the spirit and scope of the invention.

What is claimed is:

1. A voltage generator comprising:
   (a) a first line supplied with a first voltage corresponding to a source voltage;
   (b) a second line supplied with a second voltage corresponding to the ground potential; and
   (c) means connected between said first and second lines, for generating a third voltage corresponding to the product of said first voltage and a constant number greater than 0 and less than 1, said third voltage generating means comprising, a first resistor having a first end connected to said first line and a second end, a first circuit connected between the second end of said first resistor and said second line and including a second resistor and at least one diode, a second circuit connected in parallel with said first circuit and including a third resistor and at least one diode, and voltage output means connected to the second end of said first resistor, for providing a voltage generated at the second end of said first resistor corresponding to a junction between said first and second circuits as the third voltage.

2. The voltage generator according to claim 1, wherein said first circuit includes n (n being a positive integer) diodes while said second circuit includes m (m beng a positive integer less than n) diodes, whereby the third voltage is capable of being continuously adjustable in a range between the first and second voltages to a desired value by adjusting the numbers of said diodes in said first and second circuits.

3. The voltage generator according to claim 2, wherein said diodes in each of said first and second circuits are connected in series in the forward-biased relation to the first and second voltages applied to said first and second lines.

4. The voltage generator according to claim 3, wherein said second and third resistors in said first and second circuits are each connected in series with said series diodes in each said circuit.

5. A bias circuit for generating a bias voltage which varies with temperature so as to substantially cancel out a temperature drift of a transistor circuit connected thereto, comprising:

a first resistor having a first end for receiving a power source voltage and a second end, said first resistor having a first resistance $R_1$;

a first circuit having a first end connected to said second end of said first resistor and a second end grounded, said first circuit including a second resistor having a second resistance $R_2$ and n ($n \geq 0$) diodes each having a contact potential drop varying with temperature, said first resistor and n diodes being connected in series with one another;

a second circuit connected in parallel with said first circuit and including a third resistor having a third resistance $R_3$ and m ($m \geq 0$, $m+n > 1$) diodes each having the contact potential drop, said first resistor and m diodes being connected series with one another; and voltage output means connected to the second end of said first transistor, for generating a voltage, as said bias voltage, appearing at the second end of said first transistor, said bias voltage having a temperature coefficient substantially equal to:

$$-\frac{\left(\frac{n}{R_2} + \frac{m}{R_3}\right)}{\left(\frac{1}{R_1} + \frac{1}{R_2} + \frac{1}{R_3}\right)}$$

6. The bias circuit according to claim 5, wherein the number n of diodes in said first circuit is greater the number m of diodes in said second circuit.

* * * * *